United States Patent [19]

Riley et al.

[11] Patent Number: 5,168,813
[45] Date of Patent: Dec. 8, 1992

[54] BAKING TREATMENT OF LITHOGRAPHIC PRINTING PLATE

[75] Inventors: David Riley, Gregory Turner, both of Leeds, England

[73] Assignee: Horsell Plc, Leeds, England

[21] Appl. No.: 689,875

[22] PCT Filed: Oct. 2, 1989

[86] PCT No.: PCT/GB89/01167

§ 371 Date: May 22, 1991

§ 102(e) Date: May 22, 1991

[87] PCT Pub. No.: WO90/03275

PCT Pub. Date: Apr. 5, 1990

[30] Foreign Application Priority Data

Sep. 30, 1988 [GB] United Kingdom ............... 8822956

[51] Int. Cl.$^5$ ............................ B41N 3/03; B41C 1/10
[52] U.S. Cl. ................................ 101/463.1; 430/302
[58] Field of Search ....................... 101/463.1, 467; 430/432, 302

[56] References Cited

U.S. PATENT DOCUMENTS

| | | | |
|---|---|---|---|
| 3,909,267 | 9/1975 | Iwano et al. | 430/372 |
| 4,063,507 | 12/1977 | Toyama et al. | 101/467 |
| 4,191,570 | 3/1980 | Herting et al. | 430/302 |
| 4,355,096 | 10/1982 | Walls | 430/302 |
| 4,572,889 | 2/1986 | Imai et al. | 430/302 |

FOREIGN PATENT DOCUMENTS

| | | |
|---|---|---|
| 36672 | 9/1981 | European Pat. Off. |
| 182566 | 5/1986 | European Pat. Off. |
| 212387 | 3/1987 | European Pat. Off. |
| 2361668 | 6/1974 | Fed. Rep. of Germany |
| 3410522A1 | 10/1985 | Fed. Rep. of Germany |
| 1154749 | 6/1969 | United Kingdom |
| 1513368 | 6/1978 | United Kingdom |
| 2034909 | 6/1980 | United Kingdom |
| 1575200 | 9/1980 | United Kingdom |
| 2099371 | 12/1982 | United Kingdom |

OTHER PUBLICATIONS

Abstract of Japan vol. 10, No. 88 (JP-A-60.225798)
Abstract of Japan vol. 10, No. 100 (JP-A-60.236796)
International Search Report (PCT/GB89/02267).

Primary Examiner—Clifford D. Crowder

[57] ABSTRACT

A method of processing a lithographic printing plate which comprises the steps of exposing, developing and baking the plate, in which a pre-baking liquid is applied to the plate prior to the baking step, and which is not tacky, has a long storage life, and does not require rinsing with water after baking. The pre-baking liquid includes one or more of a sulphosuccinamate or sulphosuccinate and a type and present in an amount sufficient to form a non-water soluble baked coating on the developed plate which acts as an effective barrier to contaminating material tending to come into contact with the developed areas of the plate during the baking step, and which has no adverse reaction with the image and non-image areas and allows the plate to be baked, and thereby to improve the durability of the processed plate for use on a press. The baked coating is removed subsequently by an alkaline solution.

5 Claims, No Drawings

BAKING TREATMENT OF LITHOGRAPHIC PRINTING PLATE

This invention relates to a baking treatment of a lithographic printing plate.

It is well known that the inclusion of a baking stage in a lithographic printing plate treatment process increases the "run length" of the plate on a press very considerably. It is therefore usual for lithographic plate processing equipment suppliers to include a plate baking oven in their range of equipment, and which bakes the plate to produce a durable ink-receptive image area on the processed lithographic plate.

In the treatment of a lithographic printing plate, it is first exposed and then developed by hand or by the use of a processor to reveal the underlying substrate in the non-image area, prior to coating of the plate with a pre-baking solution. The plate then passes through the baking oven where it is subjected to a sufficient level of heat to convert the image area into a more durable form.

A number of baking solutions are commercially available, including Ultratherm and Thermotect, (available from Horsell Graphic Industries and Howson-Algraphy respectively) and these give generally satisfactory results, and which are of generally similar character in that they both form a water soluble layer on the processed plate.

The purpose of the baking solution is to provide temporary shielding of the non-image areas from contact with contaminants, during the baking stage, while enabling the image areas to be baked and thereby improve their durability in use on the press. Therefore, the baking solution, which forms a water soluble layer prior to baking, is believed to form a physical barrier to any contaminating material present e.g. in the oven or emanating from the image areas, but it must also be such that it does not adversely effect the image by dissolving it, or rendering image areas non ink receptive, or non-image areas ink receptive. Also, the water soluble layer is readily removable after the baking process, without the image and non-image areas being adversely affected. The use of water soluble pre-baking solutions forms the subject of, and is disclosed in more detail in UK patent 1513368.

When water soluble pre-baking solutions are employed, including particularly Ultratherm, there are serious problems if there is likely to be a long delay between issuing from the baking oven and use of the treated plate on the press. When only a short delay is anticipated, the baked plates can be taken to the press without any further treatment being required. However, if a long delay is likely, then it is usually necessary to apply three further steps in the processing of the plates after the baking step, including a rinsing step, application of a post-baking (storage gum) and a final drying step. After the rinsing step, Ultrafin or Unifin (the trade marks of Horsell Graphic Industries and Howson Algraphy respectively) is usually employed in the post-baking stage, but this may give rise to certain problems as set out later.

If these further steps are not included, and there is a lengthy delay between issue from the baking oven and use on the press, then the following technical problems can arise:

(i) sensitivity of the background is created, (ii) in humid conditions where plates are stacked they are liable to stick together, (iii) "blinding" can occur on the image area—it will not accept ink on image areas without some form of image cleaning.

However, even with the further steps included, while this does solve the problems of (a) clear background, (b) blinding, and (c) storage life, the use of these specifically available storage gums render the plates "tacky" so that they are awkward to handle and liable to pick up dirt, and can be difficult to transport through automatic conveyors contained within plate bending equipment.

The invention therefore seeks to enable an improved treatment of pre-sensitised printing plates in which a baking stage is required, by using a pre-baking solution which does not require a post-baking water rinsing stage.

The invention is therefore based on the use of a different material to form the pre-baking solution, and which does not result in the formation of a water soluble layer which, at least with preferred examples, can be subsequently removed after the baking stage, and which can result in the production of a treated lithographic printing plate for use on a press which is: (a) not tacky, (b) has a long storage life, and (c) does not require rinsing with water after baking.

According to the invention there is provided a method of processing a lithographic printing plate which comprises the steps of exposing, developing and baking the plate, in which a pre-baking liquid is applied to the plate prior to the baking step and includes one or more of a sulphosuccinamate or sulphosuccinate of a type and present in an amount sufficient to form a non-water soluble baked coating on the developed plate which acts as an effective barrier to contaminating material tending to come into contact with the developed areas of the plate during the baking step, and which has no adverse reaction with the image and non-image areas and allows the plate to be baked and thereby to improve the durability of the processed plate for use on a press.

As the material applied prior to baking is no longer water soluble after the baking stage, it will be necessary to employ an alkaline post-baking treatment.

The pre-baking liquid may include a soluble acid, and preferably phosphoric acid in a proportion of 0 to 3% by weight.

One particularly suitable type of sulphosuccinamate is made and sold in the United States under the trade mark AEROSOL 22 by Cyanamid and in the UK under the trade mark Rewopol B2003 by Rewo Chemicals, and preferably in the form of a 35% solution present in a range 10% to 100% by weight. When phosphoric acid is mixed with AEROSOL 22, preferably it is in the range 0.1% to 1% by weight.

One preferred example of pre-baking solution is set out below:

| Constituents | % by weight | Activity |
| --- | --- | --- |
| Water | 84.8% | — |
| Aerosol 22 or Rewopol B2003 (35% solution) | 15% | 5.25% |
| Phosphoric Acid (85% solution) | 0.2% | 0.17% |

This pre-baking liquid is suitable for use with conventional positive working lithographic printing plates, and also with plates which undergo conversion e.g. the Gemini process of Horsell Graphic Industries (and similar processes of other plate manufacturers). However, in this latter case, it has been found that unacceptable "cratering" can occur in the light-sensitive coating if the % of sulphosuccinamates falls below 3.5% by weight of the coating material applied for certain types of plate. However, for some types of plate, with the conversion process, lower proportions of sulphosuccinamate may be acceptable. Sulphosuccinamates have the following general structure:

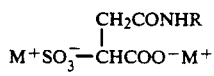

and are derivatives of succinamic acid having the general structure:

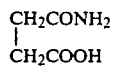

Another example of pre-baking solution is a sulphosuccinate sold under the trade mark Rewopol SBD070 by Rewo Chemicals, having the following general structure:

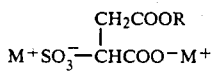

and which is a derivative of succinic acid having the general structure:

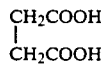

Preferably, and especially when a long delay is anticipated between treatment in the baking step and use on the press the process includes two further steps, neither of which is a rinsing step. The two further steps are the application of a post-baking solution and a drying step.

Details of examples of preferred post-baking solutions are set out below:

| Constituents | Proportions by weight |
|---|---|
| VERSICOL* EN9 | Minimum 0.5% to maximum 50% with preferred range 10% to 25% |
| Sodium metasilicate | 0.5% to 5% and preferably in the range 1% to 3% |
| ** NERVANAID DP | 0.05% to 3% and preferred range 0.1% to 0.8% |

When a post-bake solution is employed which includes a film forming material such as VERSICOL, it preferably has the following components:

| Material | % by weight | Activity |
|---|---|---|
| Water | 80% | — |
| VERSICOL EN9 (25% solution) | 17.5% | 4.375% |
| Sodium Metasilicate | 2% | 2% |
| NERVANAID DP (40% solution) | 0.5% | 0.2% |

In the formulation of suitable post-bake solutions, the NERVANAID is just one example of a suitable water softener, and other materials may be used. Sodium metasilicate is one example of an alkali for use in the solution, though other alkalis may be used, such as silicates, phosphates, amines and hydroxides. Concerning VERSICOL, alternatives include all types of polyacrylic acids, polymethacrylic acids and polyvinyl pyrollidone.

The use of sulphosuccinamates in the pre-baking liquid provides a biodegradable material which also exhibits greater environmental acceptability when compared with other commercially available pre-bake solutions.

For use in conjunction with reversible positive pre-sensitised plates, as treated with the Horsell Gemini or similar processes, this pre-baking solution may also be used to advantage where most other materials available would not work without unacceptable problems.

\* VERSICOL—This is the trade mark of Allied Colloids.

\*\* NERVANAID—This is the trade mark of ABM Chemicals.

EXAMPLES

Comparative tests were carried out using examples of pre-baking liquid in a method according to the invention, and other materials, these being carried out on a standard Horsell Libra Plate of a size 650 mm × 550 mm and a gauge 0.3 mm. This is a particular type of presensitised lithographic printing plate supplied by Horsell Graphic Industries Limited for a number of years.

First of all, the plate was exposed using a 5 kW light source with an approximate spacing of 1.2 m between the light source and the plate. The exposure time was sufficient to reveal a clear reference 2 on a stouffer step wedge using Horsell C1290 positive hand developer for one minute at 20° C. Following hand development, using cotton wool, each plate was rinsed with water and then dried.

The different types of pre-baking solution were then applied by hand using cotton wool to produce an even streak free film. This film was then dried using a fan drier. The different types of material used to form the pre-baking solution, and their relative performances, are set out in more detail later.

The plate was then placed in a moving plate oven having the oven temperature set at 575 F. and a linear speed through the oven of 1.75 m per minute. The duration of heating of each plate was approximately 41 seconds.

Once the plate has passed through the oven, it was allowed to cool, prior to application of an alkaline post-baking solution, such as any of the alkaline post-baking solutions referred to above e.g. sodium metasilicate. The purpose of this treatment is to remove the baked coating derived from the pre-bake solution, along with any contaminating material present on the plate. The resulting application of the post baking solution must prevent redepostion of contaminants onto the revealed non-image areas.

The post baking solution was applied by hand for approximately 30 seconds at 20° C.

The plate was then rinsed with water to remove the post baking solution, then squeegeed and inked.

The plate was evaluated visually in both the image and non-image areas. Any detrimental attack on the image area would be seen in the solid or half tone areas which constitute the image area.

As will be apparent from the detailed example of pre-baking solutions used, with the exception of sulphosuccinates and sulphosuccinamates, the performance of the other materials tested was unsatisfactory.

The major problem with most of the materials tested was the inability to protect the substrate from contamination. A further problem was the formation of craters in the light sensitive coating formed during baking of the pre-baking solution on the plate. These crates appeared as if the light sensitive coating had bubbled during heating, and quite often a small deposit of coating remained in the middle. This problem however is only observed on plates which have undergone the Horsell Graphic Industries "Gemini" plate conversion process, or similar process of other plate manufacturers, or on plates which have been exposed to lights prior to the baking process.

To reduce the level of background (substrate) contamination, small amounts of acid may be incorporated into the pre-bake solution. Citric acid was used with some surfactants, as it has the advantage of being water-soluble, whereas other acids used, such as phosphoric and boric acid became insoluble, and could only be removed on application of the alkaline post baking solution. In the production of positive plates, while sulphosuccinamates and sulphosuccinates provide acceptable performance in the absence of added acids (such as citric, phosphoric or boric acids), it has been found to be advantageous to add one or more such acids to the pre-baking solution.

However, in the case of plates converted by the Gemini process, it has been found to be essential to add acid to the sulphosuccinates to obtain a commercially acceptable result, and in the case of sulphosuccinamates it is certainly desirable.

The materials tested, their general class, and the results obtained are set out on the table listed below:

| Class | Type | Result |
| --- | --- | --- |
| Amphoteric | Betaine derivatives | |
| Anionic | Alkyl aryl ethern sulphates | |
| | Fatty acid soaps | |
| | Olefin sulphonates | |
| | Sarcosinates | |
| | Sodium butoxyethoxyacetate | |
| | Quaternary ammonium compounds | |
| Non-ionic | Acetylenic diols | Poor |
| | Alkylolamides | |
| | Ethoxylated alkylolamides | |
| | Ethoxylated alkyl phenois | |
| | Ethoxylated castor oil | |
| | Ethoxylated fatty acids | |
| | Ethylene oxide / propylene oxide copolymers | |
| Amphoteric | Alkyl ether hydroxypropyl sultaines | |
| | Fatty amidoamine sulphates | Moderate |
| Anionic | Phosphate esters | |
| | Sulphated fatty acid esters | |
| | Taurates | Fairly good |
| | Isethionate | |
| | * Sulphosuccinates | Very good |
| | * Sulphosuccinamates | |

* The sulphosuccinates and the sulphosuccinamates which were tested, and which provide very good results, were commercially available materials under the trade mark Rewopol SBD070 and B2003, which at present include small amounts of solvents (ethanol, propylene glycol or isopropanol) to assist in the preparation of a stable homogeneous solution for application onto the plates.
At present levels, these solvents do not have any adverse effect though it is believed that higher levels might be disadvantageous. However, while these solvents are useful in the applications of the solutions, they are not absolutely essential.

We claim:

1. A method of processing a lithographic printing plate which comprises the steps of exposing the plate, developing the plate, applying to the plate a pre-baking liquid including one or more of a sulphosuccinamate or sulphosuccinate, of a type and present in an amount sufficient to form a non water-soluble baked coating on the developed plate which acts as an effective barrier to contaminating material tending to come into contact with the developed areas of the plate during a subsequent baking step, and baking the plate, wherein the pre-baking liquid has no adverse reaction with the image and non-image areas of the plate and allows the plate to be baked thereby to improve the durability of the processed plate for use on a press.

2. A method according to claim 1, comprising a further step of treating the baked plate using an alkaline solution in order to remove the baked-on coating and any contaminants which may be present.

3. A method according to claim 1 in which the pre-baking liquid includes an acid.

4. A method according to claim 3, in which the acid is from the group consisting of citric acid, boric acid and phosphoric acid.

5. A method according to claim 1, in which said pre-baking liquid includes a sulphosuccinamate used in an amount not less than 3.5% by weight of the applied pre-baking liquid.

* * * * *